United States Patent
Shin et al.

(10) Patent No.: US 8,592,231 B2
(45) Date of Patent: Nov. 26, 2013

(54) LED PACKAGE STRUCTURE AND MANUFACTURING METHOD, AND LED ARRAY MODULE

(75) Inventors: Su-ho Shin, Seongnam-si (KR); Soon-cheol Kweon, Seoul (KR); Kyu-ho Shin, Seoul (KR); Ki-hwan Kwon, Suwon-si (KR); Seung-tae Choi, Suwon-si (KR); Chang-youl Moon, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/883,815

(22) Filed: Sep. 16, 2010

(65) Prior Publication Data
US 2011/0003412 A1 Jan. 6, 2011

Related U.S. Application Data

(62) Division of application No. 11/408,101, filed on Apr. 21, 2006, now Pat. No. 7,821,027.

(30) Foreign Application Priority Data

Jul. 29, 2005 (KR) ............... 2005-0069519

(51) Int. Cl.
*H01L 21/00* (2006.01)
(52) U.S. Cl.
USPC ............................................. 438/28; 362/368
(58) Field of Classification Search
USPC ............ 362/368, 373, 632, 800; 257/99, 100, 257/706, 707, E33.058, E33.075; 438/26, 438/28
See application file for complete search history.

(56) References Cited

U.S. PATENT DOCUMENTS

| | | | | |
|---|---|---|---|---|
| 3,671,819 A | * | 6/1972 | Swanson | 313/365 |
| 6,531,328 B1 | * | 3/2003 | Chen | 438/26 |
| 6,874,910 B2 | * | 4/2005 | Sugimoto et al. | 362/294 |
| 7,250,637 B2 | * | 7/2007 | Shimizu et al. | 257/98 |
| 2002/0153835 A1 | * | 10/2002 | Fujiwara et al. | 313/512 |
| 2003/0189830 A1 | * | 10/2003 | Sugimoto et al. | 362/294 |
| 2004/0079957 A1 | * | 4/2004 | Andrews et al. | 257/100 |
| 2005/0029535 A1 | | 2/2005 | Mazzochette et al. | |
| 2005/0151142 A1 | * | 7/2005 | Imai | 257/81 |
| 2005/0156186 A1 | * | 7/2005 | Lin et al. | 257/99 |
| 2005/0174544 A1 | * | 8/2005 | Mazzochette | 353/69 |
| 2005/0184387 A1 | | 8/2005 | Collins et al. | |
| 2005/0199900 A1 | * | 9/2005 | Lin et al. | 257/99 |
| 2005/0211997 A1 | | 9/2005 | Suehiro et al. | |
| 2005/0274959 A1 | * | 12/2005 | Kim et al. | 257/79 |
| 2006/0006406 A1 | * | 1/2006 | Kim et al. | 257/100 |
| 2006/0071222 A1 | * | 4/2006 | Yatsuda et al. | 257/90 |
| 2007/0080360 A1 | * | 4/2007 | Mirsky et al. | 257/99 |

\* cited by examiner

*Primary Examiner* — Vongsavanh Sengdara
(74) *Attorney, Agent, or Firm* — Sughrue Mion, PLLC

(57) ABSTRACT

An LED package includes a substrate having an electrically conductive portion and an electrically non-conductive portion composed of an oxide of the conductive portion; an LED mounted on the conductive portion and electrically connected to the conductive portion; a first electrode disposed on the non-conductive portion and electrically connected to the LED by a wire; and a second electrode disposed on the substrate and electrically connected to the LED.

18 Claims, 10 Drawing Sheets

LED PACKAGE STRUCTURE AND MANUFACTURING METHOD, AND LED ARRAY MODULE

CROSS-REFERENCE TO RELATED APPLICATIONS

This is a request for a Divisional Application of pending prior application Ser. No. 11/408,101 (Confirmation No. 8953) filed Apr. 21, 2006, which claims priority under 35 U.S.C. §119 from Korean Patent Application No. 2005-69519 filed Jul. 29, 2005. The entire disclosures of the prior application Ser. No. 11/408,101 and 2005-69519, are considered part of the disclosure of the accompanying divisional Application and is hereby incorporated by reference.

BACKGROUND OF THE INVENTION

1. Field of the Invention

Methods and apparatuses consistent with the present invention relate to a light emitting diode (LED) package usable for a backlight unit, such as a liquid crystal display (LCD), or a lighting apparatus, a manufacturing method thereof, and an LED array module using the same.

2. Description of the Related Art

Light emitting diodes (LEDs) have been widely used in many fields, including electronics and advertising, due to their long life and their low power consumption. Recently, there have been attempts to use LEDs as backlight units for LCD devices, and in the future, LEDs may also be widely used in common lighting systems. Therefore, there is an increasing demand for small LED packages which can efficiently dissipate heat.

LEDs used in backlight units for LCDs or in lighting apparatuses require high power consumption. However, when the temperature rises, the performance of an LED exponentially decays. Therefore, the heat dissipation properties of LEDs are important.

FIG. 1 is a sectional view of a conventional LED package. As illustrated, the LED package includes an LED 1; a heat sink member 2, on which the LED 1 is mounted; leads 3 and 3'; wires 4 and 4', which electrically connect the LED 1 to the leads 3 and 3'; and a body 5 which covers the heat sink member 2 and the leads 3 and 3'.

The heat sink member 2 has upper and lower exposed surfaces, and an insulating layer 6 is disposed on the upper exposed surface of the heat sink member 2.

The LED 1 is bonded to the center of the insulating layer 6 by means of an adhesive 7, and first ends of the leads 3 and 3' are positioned on the ends of the insulating layer 6. The second ends of the leads 3 and 3' protrude from the sides of the body 5. The wires 4 and 4' are installed to connect the LED 1 with the first ends of the leads 3 and 3'. A cap (not illustrated) may be installed on the upper portion of the body 5 for sealing the LED 1.

The above conventional LED package is mounted on a substrate 10 by soldering the pads 11 and 11' of the substrate 10 to the second ends of the leads 3 and 3'. In addition, a solder 12 is disposed between the heat sink member 2 and the substrate 10 in the LED package. Heat generated from the LED 1 is discharged through the heat sink member 2, the solder 12, and the substrate 10.

However, this conventional LED package above has a relatively long heat transfer path (i.e. LED→insulating layer→heat sink member→solder→substrate), so that it has poor thermal radiation due to an increase in thermal resistance. Accordingly, it is not suitable for a high power LED package.

Thermal resistance $R_{th}$ can be expressed as $R_{th}=L/(k*A)$. According to this equation, the thermal resistance Rth decreases as a thickness (or a heat transfer path) L decreases and as thermal conductivity k and radiating area A increase. However, since such a conventional LED package has contacts made from different materials as well as a lengthened heat transfer path due to a thicknesses of the package and of the substrate, the thermal resistance thereof is increased.

When an LED package has poor thermal radiation performance, the lifetime of the LED is decreased and peripheral parts near the LED package may deteriorate or become thermally deformed because of the heat, thus possibly causing system damage.

Additionally, such a conventional LED package requires a separate wire bonding process and when such an LED is added to an LED array module, a lengthy process of soldering a plurality of packages is required, thereby increasing the number of assembly processes required and also increasing manufacturing costs.

SUMMARY OF THE INVENTION

Accordingly, it is one exemplary object of the present invention to provide a light emitting diode (LED) package having excellent thermal radiation performance and which is suitable for a high power LED package, and low cost a manufacturing method thereof.

Another exemplary object of the present invention is to provide an LED array module and a manufacturing method thereof using the above LED package.

A light emitting diode (LED) package according to an exemplary aspect of the present invention includes a substrate with an electrically conductive portion and an electrically non-conductive portion, composed of an oxide of the conductive portion. The package also includes an LED mounted on and electrically connected to the conductive portion; a first electrode provided on the non-conductive portion and electrically connected to the LED by a wire; and a second electrode provided on the substrate and electrically connected to the LED.

The conductive portion may have a surface exposed to the outside of the LED package to be used as a thermal radiation path through which heat generated by the LED may be transferred to the exterior of the LED package. The exposed surface may include a first surface facing the LED and a second surface facing opposite to the first surface.

The second surface may have a larger surface area than the first surface.

A base electrode may be provided on the first surface, and the LED may be mounted on the base electrode by a solder.

At least one of first and second surfaces may include a plurality of surfaces.

The exposed surface may face a surface on which the LED is mounted.

The LED package may further include a passivation layer, made of an insulating material, for covering the conductive portion and a portion of first and second electrodes.

The second electrode may be formed along the conductive portion and the non-conductive portion, or otherwise may be directly connected to the base electrode.

The LED package may further include a heat sink mounted under the substrate to discharge heat generated through the conductive portion. A thermally conductive insulator may be provided between the heat sink and the substrate.

The LED package may further include a heat sink mounted under the substrate to discharge heat generated through the conductive portion, and an electrically conductive heat conductor may be provided between the heat sink and the substrate, wherein the non-conductive portion may have an insulating layer of a certain thickness for insulating the conductive portion from the electrically conductive heat conductor.

In accordance with another exemplary aspect of the present invention, there is provided a method of manufacturing a light emitting diode (LED) package. The method includes: a) providing a substrate having an electrically conductive portion, exposed at at least one surface of the substrate and an electrically non-conductive portion comprising an oxide of the conductive portion; b) forming a base electrode on the conductive portion, forming a first electrode on the non-conductive portion, forming a second electrode, and electrically connecting the second electrode to the LED; c) mounting the LED on the base electrode and electrically connecting the LED to the base electrode; and d) electrically connecting the first electrode to the LED.

The method may further include a step of e) covering the first and second electrodes and a portion of the exposed surface of the conductive portion with a passivation layer which protects these elements. The method may further comprise mounting a heat sink on the substrate.

The step of a) may include a1) forming a non-conductive portion by oxidizing a portion of an electrically-conductive body, thereby dividing the electrically-conductive body into the conductive portion and the non-conductive portion. The sub-step of a1) may comprise a11) oxidizing an edge portion of the electrically-conductive, thereby making the edge portion non-conductive and a12) oxidizing an upper surface of the electrically conductive body to a certain depth, wherein the oxidized portion of the upper surface of the electrically-conductive body is in contact with the oxidized edge portion of the electrically-conductive body.

In the sub-step of a12), a portion that is not oxidized during the first oxidizing of the body may be partially oxidized to form a non-conductive portion so that the upper and lower exposed surfaces of the conductive portion are divided into a plurality of parts.

In step a1), the upper portion of the body may be oxidized in a wider area than the oxidized lower surface of the body.

The step a1) may include preparing upper and lower masks on upper and lower surfaces of the body, patterning the upper and lower masks, and oxidizing the upper and lower surfaces of the body via the upper and lower masks.

The step b) may include b1) forming a metal layer on the upper surface of the body; and b2) patterning the metal layer, thereby forming the base electrode, the first electrode, and the second electrode.

The base electrode and the second electrode may be integrally formed.

The second electrode disposed over the conductive portion and the non-conductive portion.

In step c), the LED and the base electrode may be bonded by a solder.

The method may further include f) mounting a radiator member under the substrate for discharging heat transferred through the conductive portion. The step f) may include f1) attaching a heat sink under the substrate; and f2) providing insulation between the substrate and the heat sink.

In step f2), the lower surface of the substrate may be bonded to the heat sink using a thermally conductive insulating material.

The step f2) may include oxidizing an entire lower surface of the substrate to a certain thickness, thereby forming an insulating layer; and bonding the insulating layer and the heat sink to each other with a thermally conductive conductor.

In accordance with another exemplary aspect of the present invention, a light emitting diode (LED) array module includes: a substrate having a plurality of conductive portions and a non-conductive portion made of an oxide of the conductive portion for electrically insulating the conductive portions; a plurality of LEDs mounted on the plurality of conductive portions; a plurality of first electrodes provided on an upper surface of the non-conductive portion wherein the plurality of first electrodes are electrically connected to the LEDs, respectively, by wires; and a plurality of second electrodes provided on the upper surface of the non-conductive portion, wherein the plurality of second electrodes are electrically connected to the conductive portions, respectively.

The LED array module may further include first and second connectors provided at an end of the substrate, connecting the plurality of first and second electrodes to external terminals, respectively.

In accordance with another exemplary embodiment of the present invention, a light emitting diode (LED) array module includes a substrate having a plurality of conductive portions and a non-conductive portion made of an oxide of the conductive portion for electrically insulating the conductive portions; a plurality of LED units each comprising at least one of a red LED, a green LED, and a blue LED, wherein the plurality of LED units are mounted on the plurality of conductive portions in an array. The LED array module further includes a plurality of first electrodes provided on an upper surface of the non-conductive portion, wherein ends of the plurality of first electrodes are electrically connected to at least one LED of each LED unit by wires; and a plurality of second electrodes disposed on the upper surface of the non-conductive portion, wherein the plurality of second electrodes are electrically connected to the conductive portions. A first electrode and a second electrode connected to corresponding red, green, or blue LEDs of neighboring LED units are electrically connected to each other.

In accordance with another exemplary aspect of the present invention, a method for manufacturing a light emitting diode (LED) array module includes: a) providing a substrate having a plurality of electrically conductive portions and an electrically non-conductive portion formed with an oxide of the conductive portion for insulating the plurality of conductive portions. The conductive portion is exposed at at least one surface of the substrate. The method further includes b) forming base electrodes on upper surfaces of the conductive portions, forming first electrodes on the non-conductive portion, forming second electrodes on an upper surface of the non-conductive portion, and electrically connecting the second electrodes to the base electrodes; c) mounting the plurality of LEDs on the base electrodes and electrically connecting the LEDs to the base electrodes; and d) electrically connecting the first electrodes to the LEDs.

The method may further include e) covering the first and second electrodes with a passivation layer for protecting the first and second electrodes. The method may further comprise f) mounting a heat sink on the substrate.

The step a) may include a1) providing a metal body and oxidizing a portion of the metal body, thereby making the portion non-conductive and dividing the metal body into the plurality of conductive portions and the non-conductive portion.

The step a1) may include a11) mounting upper and lower masks on upper and lower portions, respectively, of the metal body, patterning the upper and lower masks, and oxidizing the metal body via the upper and lower masks to form the plurality of conductive portions and the non-conductive portion; and a12) oxidizing an upper portion of the plurality of conductive portions that was not previously oxidized, wherein the second oxidized portion is in contact with the first oxidized portion.

The step b) may include b1) forming a metal layer on an upper surface of the metal body; and b2) patterning the metal layer to form the plurality of the base electrodes, the first electrodes and the second electrodes.

BRIEF DESCRIPTION OF THE DRAWINGS

The above and other exemplary aspects of the present invention will become more apparent from the following detailed description of exemplary embodiments of the present invention with reference to the accompanying drawings, in which.

DETAILED DESCRIPTION OF EXEMPLARY EMBODIMENTS OF THE INVENTION

Hereinafter, a light emitting diode (LED) package, a manufacturing method thereof, and an LED array module using the same according to exemplary embodiments of the present invention will be described in detail with reference to the accompanying drawings. In the description, if it is determined that a detailed explanation of related known functions or constructions makes the gist of the invention ambiguous, it will be omitted.

Figure 1:
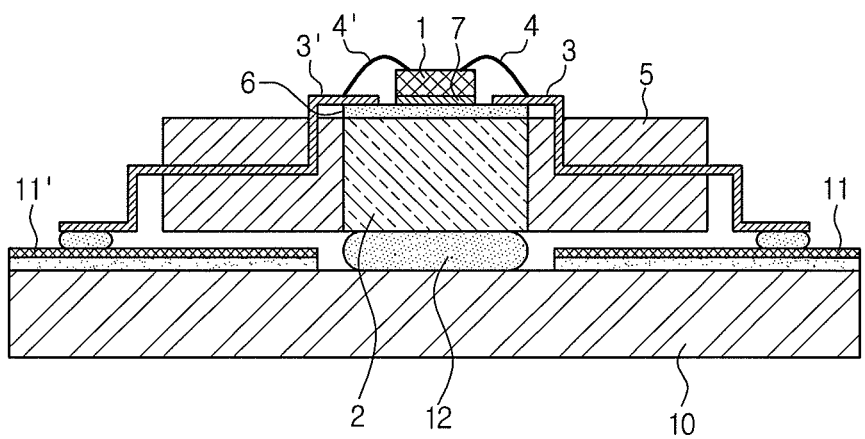
FIG. 1 is a sectional view of a conventional light emitting diode (LED) package.
Figure 2:
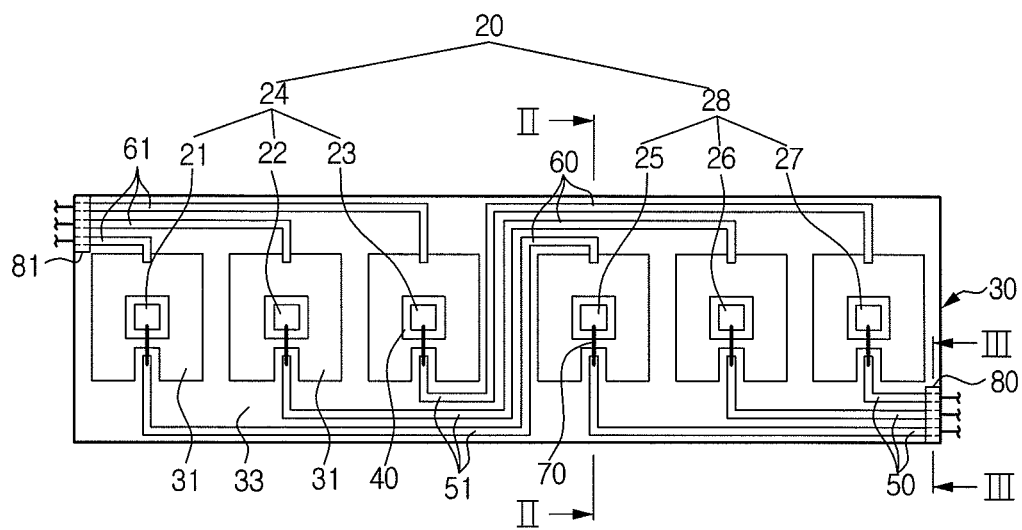
FIG. 2 is a schematic plan view of an LED array module according to an exemplary embodiment of the present invention.

As illustrated in FIG. 2, an LED array module according to a first exemplary embodiment of the invention includes a plurality of LEDs 20, a substrate 30 mounting thereon the LEDs 20, a plurality of base electrodes provided on the upper portion of the substrate 30, a first electrode 50, and a second electrode 60.

Herein, the plurality of LEDs 20 consist of a plurality of LED units 24 and 28, each having at least one of R LED 21 or 25, G LED 22 or 26, and B LED 23 or 27, respectively, emitting red light, green light and blue light, respectively. The plurality of LED units 24 and 28 are adjacent to each other and are mounted on the substrate with a certain distance. The R, G and B LEDs of the respective LED units 24 and 28 can be driven independently, or can be driven simultaneously by color (i.e., R LEDs 21 and 25, G LEDs 22 and 26, and B LEDs 23 and 27).

The substrate 30 includes a plurality of electrically conductive portions 31 on which are the LEDs 21, 22, 23, 25, 26 and 27, are mounted, respectively, and an electrically non-conductive portion 33 for insulating the conductive portions 31.

The plurality of conductive portions 31 are spaced from each other, and each LED is mounted on the upper surface of one of the conductive portions 31, thereby forming a number of LED packages. Hereinafter, an exemplary LED package will be explained in detail with reference to an LED package unit.

Figure 3:
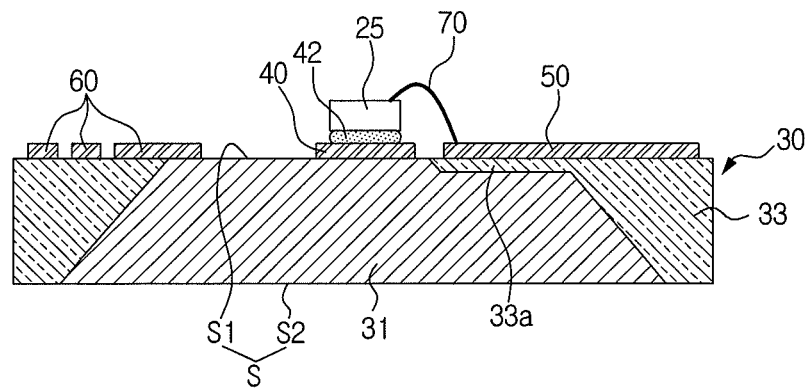
FIG. 3 is a sectional view taken along a line II-II of FIG. 2.

Referring to FIG. 3, an LED package unit is constructed such that an LED 25 is mounted on a substrate 30 having a conductive portion 31 and a non-conductive portion 33.

The conductive portion 31 is used as a heat radiating path for discharging heat from the LED 25 and has upper and lower exposed surfaces S. The exposed surfaces S include a first, upper surface S1 and a second, lower surface S2. The second surface S2 is wider than the first surface S1 so that more heat is discharged toward the lower surface of the substrate 30. The conductive portion 31 may comprise a metal material with good thermal conductivity.

The non-conductive portion 33 comprises an insulating material for insulating the conductive portions 31, and may comprise an oxide of the metal which forms the conductive portion 31. The conductive portion 31 may be aluminum or an aluminum alloy, and the non-conductive portion 33 may be an aluminum oxide ($Al_2O_3$). That is, the non-conductive portion 33 can comprise an oxidization of an aluminum body that is the same material as the conductive portion 31. The non-conductive portion 33 covers the conductive portion 31. In addition, the non-conductive portion 33 may include an extension 33a which extends to cover a certain portion of the conductive portion 31.

The plurality of base electrodes 40 have a certain thickness and area and are formed on the upper surfaces of the respective conductive portions 31. The LED 25 is mounted on the upper portion of the base electrode 40 and is bonded thereto via solder 42. Accordingly, the LED 25 is electrically connected to the conductive portion 31 through the solder 42 and the base electrode 40. Thus, heat generated by the LED 25 is transferred to the conductive portion 31 through the solder 42 and the base electrode 40.

The first electrode 50 has a certain thickness and shape and is formed on the upper surface of the non-conductive portion 33. The first electrode 50 is electrically connected to the LED 25 such that a first end thereof extends along the extension 33a near the LED 25 and is connected to the LED 25 by a wire 70. The second end of the first electrode 50 extends toward a portion of the non-conductive portion 33 and is connected to a first connector 80, which itself is connected to an external terminal.

The second electrode 60 has a certain thickness and shape and is formed on the upper surface of the non-conductive portion 33. A first end of the second electrode 60 extends to the upper surface of the conductive portion 31 and is electrically connected to the conductive portion 31. The second end of the second electrode 60 can be connected to a second connector 81 opposite to the first connector. As illustrated in FIG. 2, the second electrode 60 is electrically connected to a first electrode 51, which itself is connected to the R LED 21 via a wire 70.

According to the construction as described above, as illustrated in FIG. 2, the LED pairs 21 and 25, 22 and 26, and 23 and 27, emit the same color light, and are electrically serially connected to each other by first and second electrodes 51 and 60 disposed on the non-conductive portion 33, respectively. Accordingly, the second electrodes 61, which are electrically connected to the LEDs 21, 22 and 23, are also connected to the second connector 81 through the conductive portions 31.

The base electrode 40, the first electrodes 50 and 51, and the second electrodes 60 and 61 all can be made of a metal material, for example, aluminum (Al), copper (Cu), platinum (Pt), silver (Ag), titanium (Ti), chromium (Cr), gold (Au) or nickel (Ni) by a method of forming a single or multi-layered material such as deposition, sputtering or plating.

Although the LED array module according to an exemplary embodiment of the present invention has been described to have two LED units 24 and 28 including pairs of like-colored and simultaneously-driven LEDs, an LED array module according to the present invention is not limited to this construction. For example, two or more LED units can be arranged in an array.

Figure 4A:
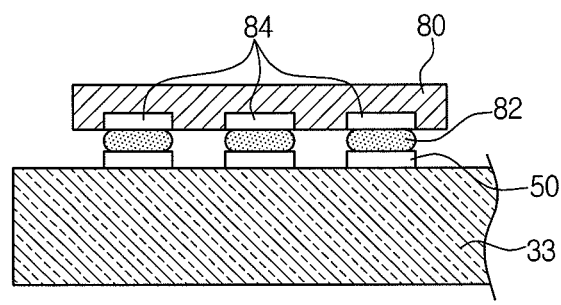
FIG. 4A is a sectional view taken along a line III-III of FIG. 2.

Examples of first and second connectors 80 and 81, which electrically connect the LED array module to external terminals, are illustrated in FIG. 4A. FIG. 4A is a sectional view taken along a line III-III of FIG. 2. The first connector 80 may be individually manufactured by a manufacturing method in which a plurality of connector electrodes 84 are covered by a case 83. The exposed surface of the connector electrode 84 and the end portion of the first electrode 50 are electrically connected with each other by solder 82. The second connector 81 may also have the same construction as the first connector 80.

Figure 4B:
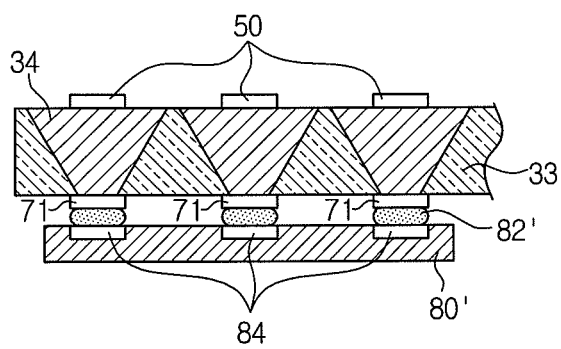
FIG. 4B is a sectional view of another exemplary embodiment of a connector illustrated in FIG. 4A.

With reference to FIG. 4B, a connector 80' according to another exemplary embodiment is illustrated. In FIG. 4B, a plurality of vias 34 are provided in the non-conductive portion 33. A conductor fills the vias permitting current to flow between the upper and lower surfaces of the substrate 30. A plurality of wires 71 are provided under the substrate 30 and are connected to the plurality of vias 34. The connector 80' may be individually manufactured by a method in which a plurality of connector electrodes 84 are covered by a case. The connector 80' is electrically connected to the plurality of wires 71 by solder 82'. The conductive material in the vias 34 can be formed by the same method as the conductive portion 31, described before. Accordingly, the conductive material in the vias 34 may be an aluminum material which is insulated from the conductive portion 31 by the non-conductive portion 33.

The second connector 81 for connecting the second electrodes 61 to another other LED array module or to an external power source may also have the same construction as that of the connector 80', described above.

Figure 5:
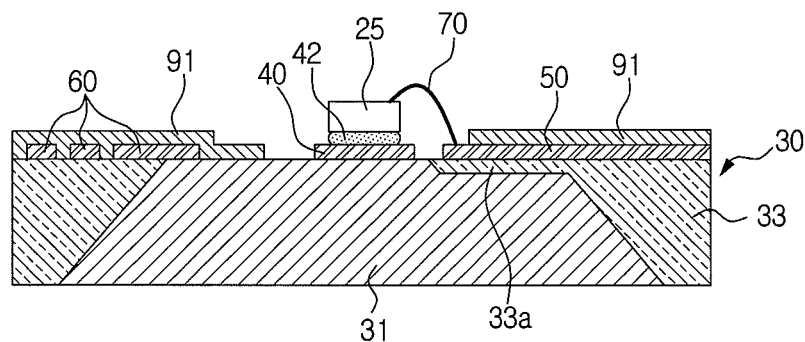
FIG. 5 is a sectional view of an LED package according to a second exemplary embodiment of the present invention.

FIG. 5 is a sectional view of an LED package according to a second exemplary embodiment of the present invention.

Referring to FIG. 5, an LED package according to the second exemplary embodiment includes a passivation layer 91 formed to cover the upper portions of first and second electrodes 50 and 60 and a portion of the upper surface of the conductive portion 31. The passivation layer 91 can prevent first and second electrodes 50 and 60 from being damaged or broken by external shock. In addition, the passivation layer can prevent the electrodes 50 and 60 from being degraded in their electrical characteristics. The passivation layer 91 can be formed by applying an insulator such as a photosensitive polymer to the conductive portion, or by laminating a protective film and patterning the same.

Figure 6:
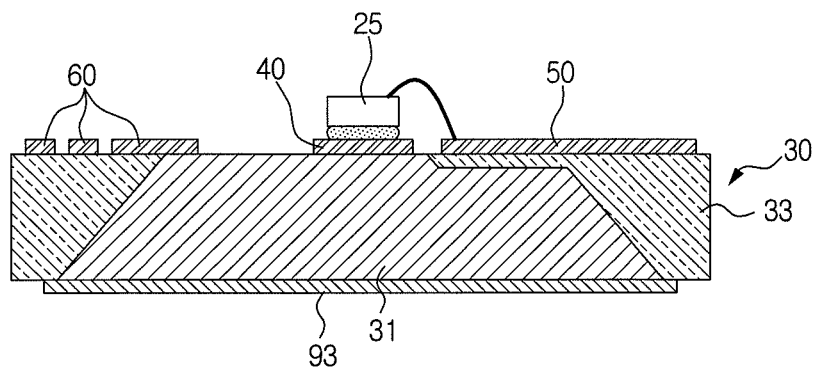
FIG. 6 is a sectional view of an LED package according to a third exemplary embodiment of the present invention.

Referring to FIG. 6, an LED package according to a third exemplary embodiment of the present invention includes a metal layer 93 provided beneath the lower surface of the conductive portion 31. In an LED array module, the plurality of metal layers 93 are provided beneath the substrate 30 correspondingly to the respective conductive portions 31, and are separated and insulated from each other. Thus, metal layer 93 can be patterned by the same material and forming method as the base electrode 40, the first electrode 50 and the second electrode 60. This metal layer 93 serves to discharge heat transferred through the conductive portion 31.

In addition, the metal layer 93 can improve an electrical connection with a circuit board when an LED package is mounted on a circuit board, such as a printed circuit board (PCB).

Figure 7A:
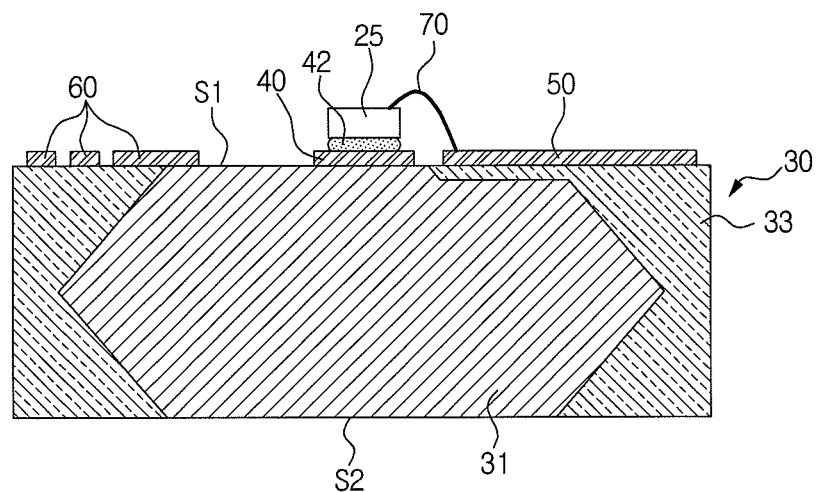
FIG. 7A is a sectional view of an LED package according to a fourth exemplary embodiment of the present invention.
Figure 7B:
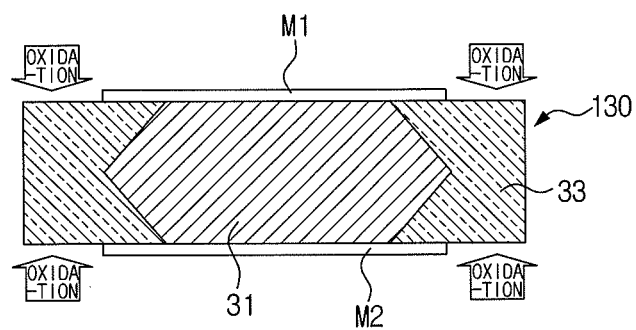
FIG. 7B is a schematic sectional view for explaining an exemplary method of manufacturing a substrate illustrated in FIG. 7A.

Referring to FIG. 7A, in an LED package according to a fourth exemplary embodiment of the present invention, a thickness of the substrate 30 is thick. Specifically, as an LED package increases in size, deformations may be generated in the LED package due to thermal or mechanical stresses during the manufacturing or treating processes. According to this construction, as illustrated in FIG. 7B, a substrate 30 having a conductive portion 31 and a non-conductive portion 33 can be formed by oxidizing both surfaces of a body 130 without the addition of a separate process, thereby increasing the thickness of the LED package.

In order to form the non-conductive portion 33 as described above, as illustrated in FIG. 7B, the conductive body 130 of the substrate material may be oxidized to form a partially oxidized non-conductive portion. Specifically, upper and lower masks M1 and M2 are provided on upper and lower portions of the body 130, edge portions of the respective masks M1 and M2 are patterned with the same pattern, and the body 130 is oxidized with an anodizing process to form the non-conductive portion 33 and leave the remaining conductive portion 31.

Figure 8A:
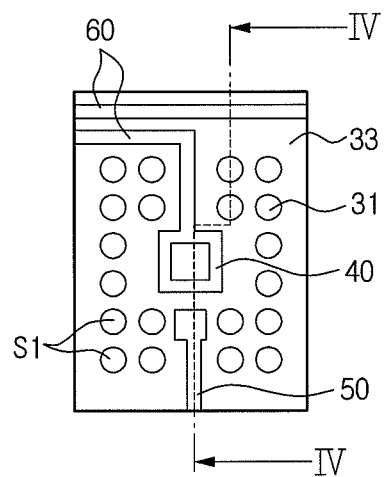
FIG. 8A is a plan view of an LED package according to a fifth exemplary embodiment of the present invention.
Figure 8B:
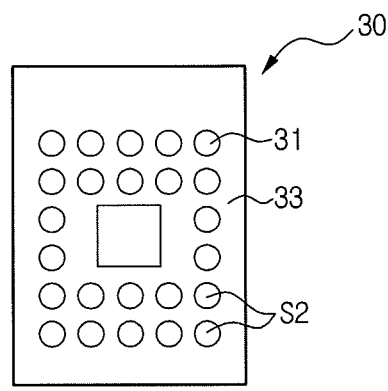
FIG. 8B is a bottom view of the LED package illustrated in FIG. 8A.
Figure 8C:
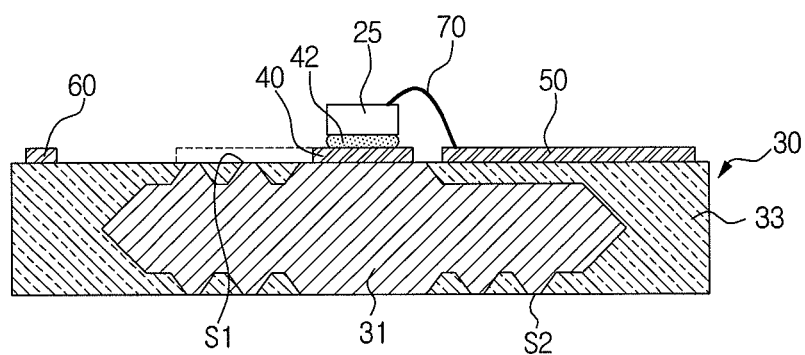
FIG. 8C is a sectional view taken along a line IV-IV of FIG. 8A.

Referring to FIGS. 8A to 8C, in an LED package according to a fifth exemplary embodiment of the present invention a plurality of first and second exposed surfaces S1 and S2 of the conductive portion 31 are provided. That is, the conductive portion 31 is provided with a plurality of vias in upper and lower surfaces of the substrate 30, thereby enabling the discharge of heat. In addition, the conductive portion 31 is provided with a plurality of exposed surfaces S1 and S2, so that upon thermal expansion of the conductive portion 31, parts of the conductive portion are prevented from being deformed by the non-conductive portion 33, thus avoiding deformation or breakage of the substrate 30.

In addition, as illustrated in FIG. 8A, in an LED package of this embodiment, the base electrode 40 and the second electrode 60 are directly connected with each other. Accordingly, the second electrode 60 is provided on the upper surface of the non-conductive portion 33. In this case, the conductive portion 31 does not serve as an electrode, but serves only as a radiator member. The area, number, and shape of the exposed surfaces S1 and S2 can be designed in various types.

Figure 9:
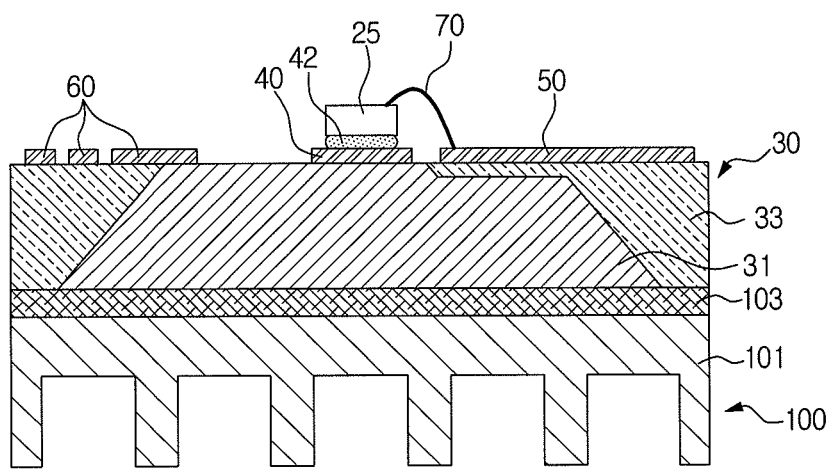
FIG. 9 is a sectional view of an LED package according to a sixth exemplary embodiment of the present invention.

Referring to FIG. 9, in an LED package according to a sixth exemplary embodiment of the present invention, a radiator member 100 is attached beneath the substrate 30. The radiator member 100 includes a heat sink 101 made of a metal material such as Al or Cu, and an insulator 103 which insulates the heat sink 101 from the substrate 30. The insulator 103 bonds the conductive portion 31 of the substrate 30 and the heat sink 101. In addition, this insulator 103 may be formed with a thermally conductive insulating material, such as good thermal conductivity polymer film, so as to allow heat of the conductive portion 31 to be smoothly transferred to the heat sink 101.

Figure 10:
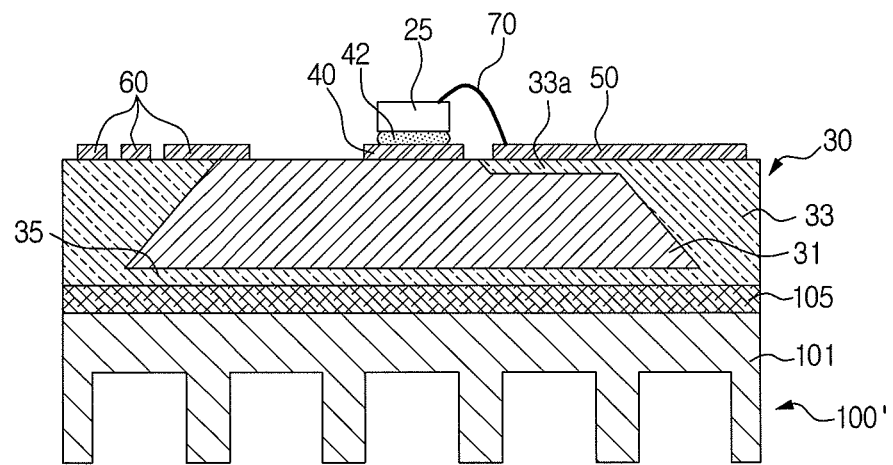
FIG. 10 is a sectional view of an LED package according to a seventh exemplary embodiment of the present invention.

Referring to FIG. 10, in an LED package according to a seventh exemplary embodiment of the present invention an insulating layer 35 having a certain thickness is integrally formed beneath the lower surface of the substrate 30, and a radiator member 100' is bonded under the insulating layer 35.

The insulating layer 35 is formed with the same material as the non-conductive portion, i.e., an aluminum oxide.

The radiator member 100' includes a heat sink 101, and an electrically conductive thermal conductor 105 for bonding the heat sink 101 to the substrate 30. The thermal conductor 105 may be formed with relatively high thermal conductivity electrically conductive material. Accordingly, through the insulating layer 35, which has a higher thermal conductivity than polymer, heat transfer to the radiator member 100' can be smoothly conducted. Herein, the insulating layer 35 can be formed by the same method that oxidized the substrate 30a second time in order to form the extension 33a of the non-conductive portion 33.

Hereinafter, an exemplary method for manufacturing an LED package as illustrated in FIG. 5 will be explained in detail.

Figure 11A:
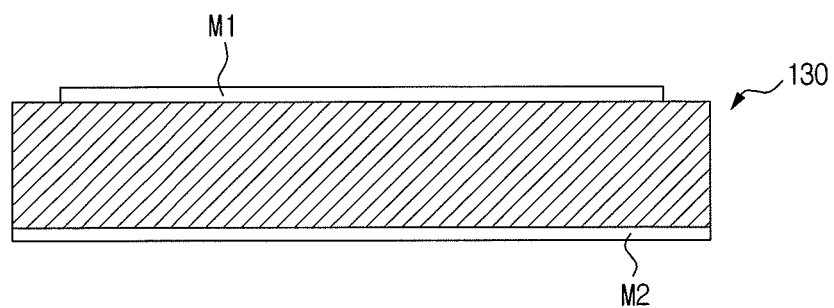
FIGS. 11A to 11E are sectional views for explaining an exemplary method of manufacturing the LED package illustrated in FIG. 5.

Referring first to FIG. 11A, upper and lower masks M1 and M2 are provided on upper and lower surfaces, respectively, of the body 130. The body 130 may be made of conductive metal material, for example, an aluminum material. At least one M1 of the masks is patterned and removed. For example, in order to form a conductive portion which is wider beneath the lower surface of the body 130, as illustrated in FIG. 11A, the upper mask M1 is patterned and removed to expose a larger portion of the upper surface of the body 130.

Figure 11B:
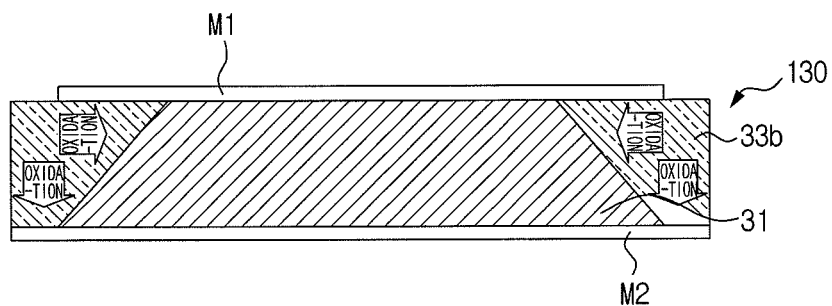

Next, as illustrated in FIG. 11B, the body 130 is oxidized. Then, the exposed portion of the body 130 which was exposed by the first oxidizing process is oxidized a second time to form a non-conductive portion 33b.

Figure 11C:
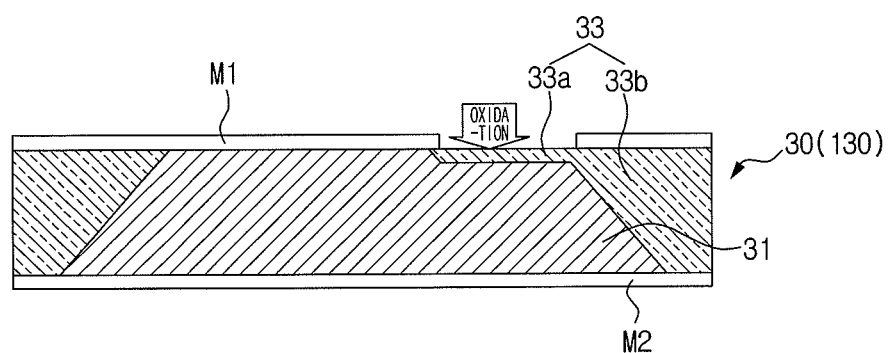

Next, as illustrated in FIG. 11C, the upper surface of the body 130 is patterned using a new mask, and a portion of the body 130, corresponding to an upper portion of the conductive portion 31, is then oxidized. The exposed portion of the body 130 is oxidized to a certain thickness to form an oxidized non-conductive extension 33a. The extension 33a connects with the first non-conductive portion 33b, thus forming the desired non-conductive portion 33.

Figure 11D:
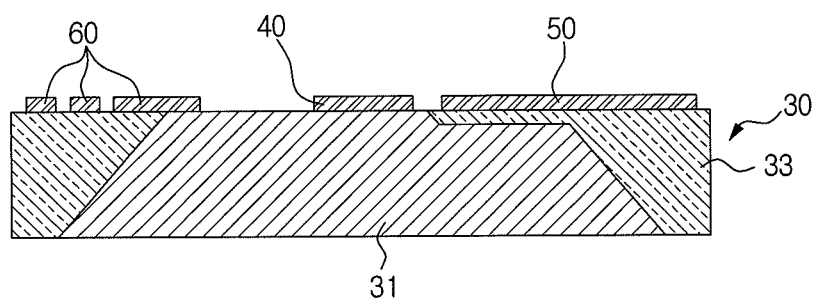

Next, the masks M1 and M2 are removed, and as illustrated in FIG. 11D, an electrically conductive metal material is applied to the upper surface of the substrate 30 by a method of deposition, such as sputtering or plating. The metal material is etched in a certain pattern to form the base electrode 40, the first electrode 50, and the second electrode 60.

Figure 11E:
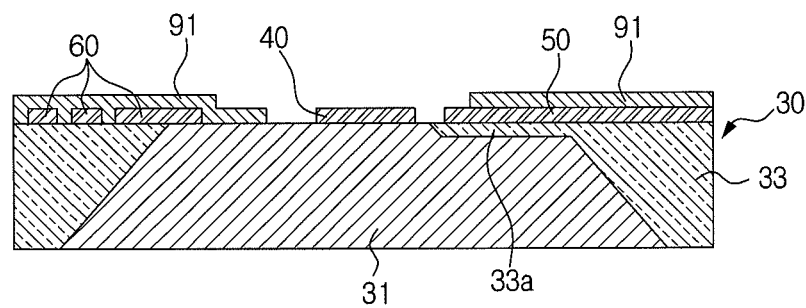

Then, as illustrated in FIG. 11E, a passivation layer 91 is patterned to cover the base electrode 40, the first electrode 50, and the second electrode 60. The passivation layer 91 may be formed by applying an insulator such as photosensitive polymer, or by laminating a protective film and patterning the same. Herein, a certain portion of the first electrode 50, i.e., a portion to be connected with the LED 25 by the wire, is exposed.

After the formation of the passivation layer 91 as above, the LED 25 is bonded on the base electrode 40 using the solder 42, and the LED 25 and the exposed portion of the first electrode 50 are electrically connected using the wire 70, thereby forming a state illustrated in FIG. 5.

In addition, as illustrated in FIG. 5, when the heat sink 101 is bonded beneath the lower portion of the substrate 30, the embodiment illustrated in FIG. 9 can be obtained.

Meanwhile, the shape and area of the exposed surface of the conductive portion 31 of the substrate 30, and the shape of the non-conductive portion 33 may vary according to the pattern formation of upper and lower masks M1 and M2 used in the first and second oxidizing processes of the above method.

In addition, according to a process of manufacturing similar to that described above, an LED array module in which the plurality of LEDs 21, 22, 23, 25, 26 and 27 are mounted (as shown in FIG. 2) can be manufactured. In this case, conductive portions 31 for an LED package unit are formed by first and second oxidation processes such that they are separated from each other by the non-conductive portion 33. Through the processes thereafter, the base electrode 40, and first and second electrodes 50 and 60 are formed. Then, each LED is mounted on a base electrode 40, and each LED is connected with a first electrode 50 using a wire 70.

Figure 12:
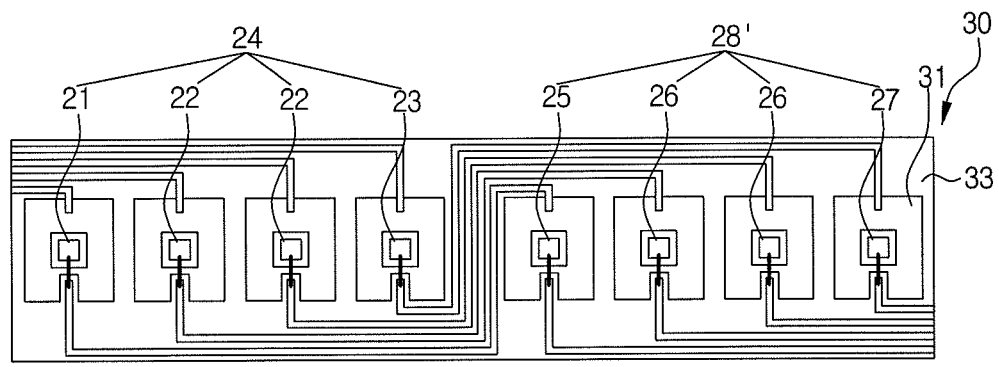
FIG. 12 is a schematic plan view of an LED package according to another exemplary embodiment of the present invention.

In addition, as illustrated in FIG. 12, in an LED array module according to another embodiment of the present invention a plurality of LED units 24' and 28' are provided. The respective LED units 24' and 28' each include a plurality of LEDs emitting at least one of red, green, and blue light. As shown in FIG. 12, a plurality of green LEDs 22 and 26 are provided, and the respective green LEDs 22 and 26 are disposed adjacent to each other and are serially connected to each other.

According to exemplary embodiments described above, a light, thin, and small LED package having an excellent thermal radiation performance can be manufactured by a simplified manufacturing process. Accordingly, a high power LED package used for a backlight unit of a liquid crystal display, or used in lighting systems can be easily and inexpensively manufactured. An LED array module with a high reliability can also be inexpensively and easily manufactured.

Further, since a distance between an LED and an electrode can be reduced, a connection wire can thus be shortened, thereby providing more stable electrical characteristics.

The foregoing embodiments and advantages are merely exemplary and are not to be construed as limiting the present invention. The above descriptions can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method of manufacturing a light emitting diode (LED) package, the method comprising:

a) providing a substrate comprising an electrically conductive portion and an electrically non-conductive portion, wherein an upper surface of the electrically conductive portion is exposed and wherein the electrically non-conductive portion comprises an oxide of the electrically conductive portion;

b) forming a base electrode on the upper surface of the electrically conductive portion such that an entire bottom surface of the base electrode is disposed on the electrically conductive portion contacting thereto, forming a first electrode on the non-conductive portion, forming a second electrode, and electrically connecting the second electrode to the base electrode, wherein at least a part of the second electrode is formed directly on and directly contacting an uppermost surface of the electrically non-conductive portion;

c) mounting an LED on the base electrode such that an entire bottom surface of the LED is disposed on the base electrode, and electrically connecting the LED to the base electrode; and d) electrically connecting the first electrode to the LED.

2. The method as claimed in claim 1, further comprising:

e) covering the first and second electrodes and a portion of the exposed upper surface of the electrically conductive portion with a passivation layer.

3. The method as claimed in claim 2, further comprising:

f) mounting a heat sink on the substrate.

4. The method as claimed in claim 2, further comprising:

f) mounting a thermal radiator member under the substrate.

5. The method as claimed in claim 4, wherein operation f) comprises:

f1) attaching a heat sink under the substrate; and f2) providing insulation between the substrate and the heat sink.

6. The method as claimed in claim 5, wherein operation f2) comprises:

oxidizing an entire lower surface of the substrate, thereby forming an insulating layer; and bonding the insulating layer and the heat sink to each other with a thermally conductive conductor.

7. The method as claimed in claim 1, wherein operation a) further comprises:

a1) forming the electrically non-conductive portion by oxidizing a portion of an electrically-conductive body, thereby dividing the electrically conductive body into the electrically conductive portion and the electrically non-conductive portion.

8. The method as claimed in claim 7, wherein operation a1) further comprises:

a11) oxidizing an edge portion of the electrically conductive body, thereby making the edge portion non-conductive; and a12) oxidizing a portion of an upper surface of the electrically conductive body to a certain depth, wherein the oxidized portion of the upper surface of the electrically conductive body is in contact with the oxidized edge portion of the electrically conductive body.

9. The method as claimed in claim 8, wherein the portion of the upper surface oxidized in operation a12 forms a non-conductive portion thereby dividing the upper and lower exposed surfaces of the electrically conductive portion into a plurality of parts.

10. The method as claimed in claim 1, wherein operation b) comprises:

b1) forming a metal layer on an upper surface of the substrate; and b2) patterning the metal layer, thereby forming the base electrode, the first electrode, and the second electrode.

11. The method as claimed in claim 10, wherein in the operation b2), the base electrode and the second electrode comprise a single electrode.

12. The method as claimed in claim 1, wherein in operation c), the LED and the base electrode are bonded by a solder.

13. The method as claimed in claim 1, wherein the entire bottom surface of the base electrode contacts the electrically conductive portion.

14. A method of manufacturing a light emitting diode (LED) array module, the method comprising:

a) providing a substrate comprising a plurality of electrically conductive portions and an electrically non-conductive portion, wherein the conductive portion is exposed at at least an upper surface of the substrate and wherein the non-conductive portion comprises an oxide of the conductive portions;

b) forming base electrodes on upper surfaces of the conductive portions such that an entire bottom surface of each of the base electrodes is disposed on a conductive portion, forming first electrodes on the non-conductive portion, forming second electrodes on an upper surface of the non-conductive portion, and electrically connecting ends of the second electrodes to the base electrodes through the conductive portion;

c) mounting a plurality of LEDs on the base electrodes such that entire bottom surfaces of the plurality of LEDs are disposed on the base electrodes, and electrically connecting the LEDs to the base electrodes; and d) electrically connecting the first electrodes to the LEDs.

15. The method as claimed in claim 14, further comprising:

e) covering the first and second electrodes with a passivation layer.

16. The method as claimed in claim 15, further comprising:

f) mounting a heat sink on the substrate.

17. The method as claimed in claim 14, wherein step a) comprises:

a1) providing a metal body and oxidizing a portion of the metal body, thereby making the portion non-conductive and dividing the metal body into the plurality of conductive portions and the non-conductive portion.

18. The method as claimed in claim 14, wherein step b) comprises:

b1) forming a metal layer on an upper surface of the substrate; and b2) patterning the metal layer, thereby forming the plurality of base electrodes, the first electrodes, and the second electrodes.

* * * * *